(12) United States Patent
Kurcharski (10) Patent No.: US 8,890,566 B2
(45) Date of Patent: Nov. 18, 2014

(54) LOW-VOLTAGE, HIGH-SPEED, CURRENT-MODE LATCH WITH INDUCTOR TAIL AND COMMON-MODE FEEDBACK FOR AMPLITUDE AND CURRENT CONTROL

(71) Applicant: Daniel Kurcharski, San Diego, CA (US)

(72) Inventor: Daniel Kurcharski, San Diego, CA (US)

(73) Assignee: Semtech Corporation, Camarillo, CA (US)

( * ) Notice: Subject to any disclaimer, the term of this patent is extended or adjusted under 35 U.S.C. 154(b) by 111 days.

(21) Appl. No.: 13/628,786

(22) Filed: Sep. 27, 2012

(65) Prior Publication Data

US 2014/0084958 A1    Mar. 27, 2014

(51) Int. Cl.
*H03K 19/003*    (2006.01)
*H03K 19/094*    (2006.01)

(52) U.S. Cl.
CPC .................................. *H03K 19/09432* (2013.01)
USPC ................... 326/31; 326/34; 326/86; 326/90; 326/115

(58) Field of Classification Search
CPC .......... H03K 19/09432; H03K 17/693; H03K 19/00384; H03K 19/088; H03K 19/084; H03K 19/013; H03K 5/2418
USPC ........ 326/31, 34, 82–83, 86, 89–90, 112, 115
See application file for complete search history.

(56) References Cited

U.S. PATENT DOCUMENTS

| | | | | |
|---|---|---|---|---|
| 5,602,498 | A * | 2/1997 | Satoh et al. | 326/126 |
| 6,525,571 | B2 * | 2/2003 | Green | 326/115 |
| 6,774,721 | B1 * | 8/2004 | Popescu et al. | 330/253 |
| 6,777,988 | B2 * | 8/2004 | Tung et al. | 327/115 |
| 7,009,425 | B1 * | 3/2006 | Loinaz et al. | 326/83 |
| 7,098,697 | B2 * | 8/2006 | Kucharski et al. | 326/126 |
| 7,884,658 | B2 * | 2/2011 | Kinget et al. | 327/208 |
| 2004/0100307 | A1 * | 5/2004 | Wong et al. | 326/115 |
| 2004/0227544 | A1 * | 11/2004 | Yin et al. | 327/65 |
| 2006/0198235 | A1 * | 9/2006 | Mohanavelu et al. | 365/233 |
| 2007/0018694 | A1 * | 1/2007 | Chen et al. | 326/115 |
| 2008/0191770 | A1 * | 8/2008 | Nedovic et al. | 327/212 |
| 2013/0314164 | A1 * | 11/2013 | Din et al. | 330/296 |

* cited by examiner

*Primary Examiner* — Jason M Crawford
(74) *Attorney, Agent, or Firm* — Amin, Turocy & Watson, LLP (57) ABSTRACT

Described herein is a low-voltage circuit with an inductor tail and a common mode feedback loop for amplitude and current control. A first transistor pair can receive clock inputs, and a second transistor pair can receive data inputs and output the data to a logic gate. A tail inductor can be coupled to the first transistor pair to suppress high frequency common mode bounce induced by clock transitions in independent common emitter branches. A common mode feedback loop can be provided to maintain a constant average current. The common mode feedback loop and the tail inductor can together function in the same way as a tail current source at low frequencies and high frequencies respectively.

20 Claims, 8 Drawing Sheets

LOW-VOLTAGE, HIGH-SPEED, CURRENT-MODE LATCH WITH INDUCTOR TAIL AND COMMON-MODE FEEDBACK FOR AMPLITUDE AND CURRENT CONTROL

TECHNICAL FIELD

This disclosure generally relates to low-voltage circuit design, and specifically to a low-voltage circuit with an inductor tail and a common-mode feedback loop for amplitude and current control.

BACKGROUND

Some digital data streams, especially high speed serial data streams are sent without accompanying clock signals. The receiver generates a clock from an approximate frequency reference, and then phase-aligns to the transitions in the data using a clock and data receovery ("CDR") process. Jitter in the signal, which is the undesired deviation from a true periodocity of an assumed periodic signal, can cause data loss during the processing of the high speed data streams.

Jitter tolerant CDR circuits can be constructed using emitter coupled logic ("ECL") with a tail source to provide amplitude and current stabilization. These circuits are often run at the 2.8-3.6V operating voltage that is typically used for high speed bi-polar logic. Reducing the voltage, which in turn reduces the power consumption, in these high speed data path circuits in a CDR or Serializer/Deserializer ("SerDes") (such as data samplers, phase detectors, multiplexers, and demultiplexers) means performance is sacrificed.

The above-described deficiencies of high speed data path circuits operated at low voltage are merely intended to provide an overview of some problems of current technology, and are not intended to be exhaustive. Other problems with the state of the art, and corresponding benefits of some of the various non-limiting implementations described herein may become further apparent upon review of the following detailed description.

SUMMARY

The following presents a simplified summary to provide a basic understanding of some aspects of the subject disclosure. This summary is not an extensive overview of the disclosed subject matter. It is not intended to identify key or critical elements of the disclosed subject matter, nor is it intended to delineate the scope of the subject disclosure. Its sole purpose is to present some concepts of the disclosed subject matter in a simplified form as a prelude to the more detailed description presented later.

In one embodiment of the subject disclosure, a low voltage circuit includes a first transistor pair that accepts clock inputs and a second transistor pair that receives data inputs and sends data outputs to a logic gate. The second transistor pair is stacked on the first transistor pair. The low voltage circuit also includes a tail inductor coupled to the first transistor pair, and in some implementations a common mode feedback loop. The tail inductor and the common mode feedback loop are coupled to one or more low voltage circuits. The tail inductor stabilizes current flow during high frequency clock transitions and the common mode feedback loop maintains a constant average current.

In another implementation of the subject disclosure, clock inputs are received, data inputs are received and then outputted to a logic gate. A constant average current is maintained using a common mode feedback loop, and common mode bounce that is induced by high frequency clock transitions is suppressed using a tail inductor.

The following description and the annexed drawings set forth in detail certain illustrative aspects of the disclosed subject matter. These aspects are indicative, however, of but a few of the various ways in which the principles of the innovation may be employed. The disclosed subject matter is intended to include all such aspects and their equivalents. Other advantages and distinctive features of the disclosed subject matter will become apparent from the following detailed description of the innovation when considered in conjunction with the drawings.

BRIEF DESCRIPTION OF THE DRAWINGS

Non-limiting and non-exhaustive implementations of the subject disclosure are described with reference to the following figures, wherein like reference numerals refer to like parts throughout the various views unless otherwise specified.

DETAILED DESCRIPTION

In the following description, numerous specific details are set forth to provide a thorough understanding of the implementations of the subject disclosure. One skilled in the relevant art will recognize, however, that the implementations described herein are practiced without one or more of the specific details, or with other methods, components, materials, etc. In other instances, well-known structures, materials, or operations are not shown or described in detail to avoid obscuring certain aspects.

According to an aspect of the subject disclosure, described herein is a low voltage architecture that uses a tail inductor to stabilize current during high frequency clock transitions and a common mode feedback loop to stabilize average current. The supply voltage for the circuit can be 1.5V or below while delivering performance on par with the 2.8-3.6V ECL counterparts. This allows the power consumption of the circuit to be 2-4 times lower than the traditional high speed bipolar logic. In some implementations, the low voltage circuit includes just the tail inductor, depending on the frequency of the clock transitions. The low voltage architecture provides for high speed data path circuits in a CDR or SerDes (such as data samplers, phase detectors, multiplexers, and demultiplexers) to operate from a low-voltage power supply without sacrificing performance, which in turn reduces power consumption.

In an implementation of the subject disclosure, the low voltage circuit features limited transistor stacking and includes two transistor levels. The top level accepts data inputs and sends data outputs to the next logic gate or circuit. The bottom level accepts clock inputs. Instead of using a tail current source, or a tail resistor to stabilize current flow, a common mode feedback ("CMFB") loop is used to assure that the average current remains constant. In addition, a tail inductor is used to stabilize current flow during clock transitions. Together, the CMFB loop and the tail inductor provide functionality similar to a tail current source (at low frequencies and high frequencies respectively) without using additional voltage headroom.

Figure 1:
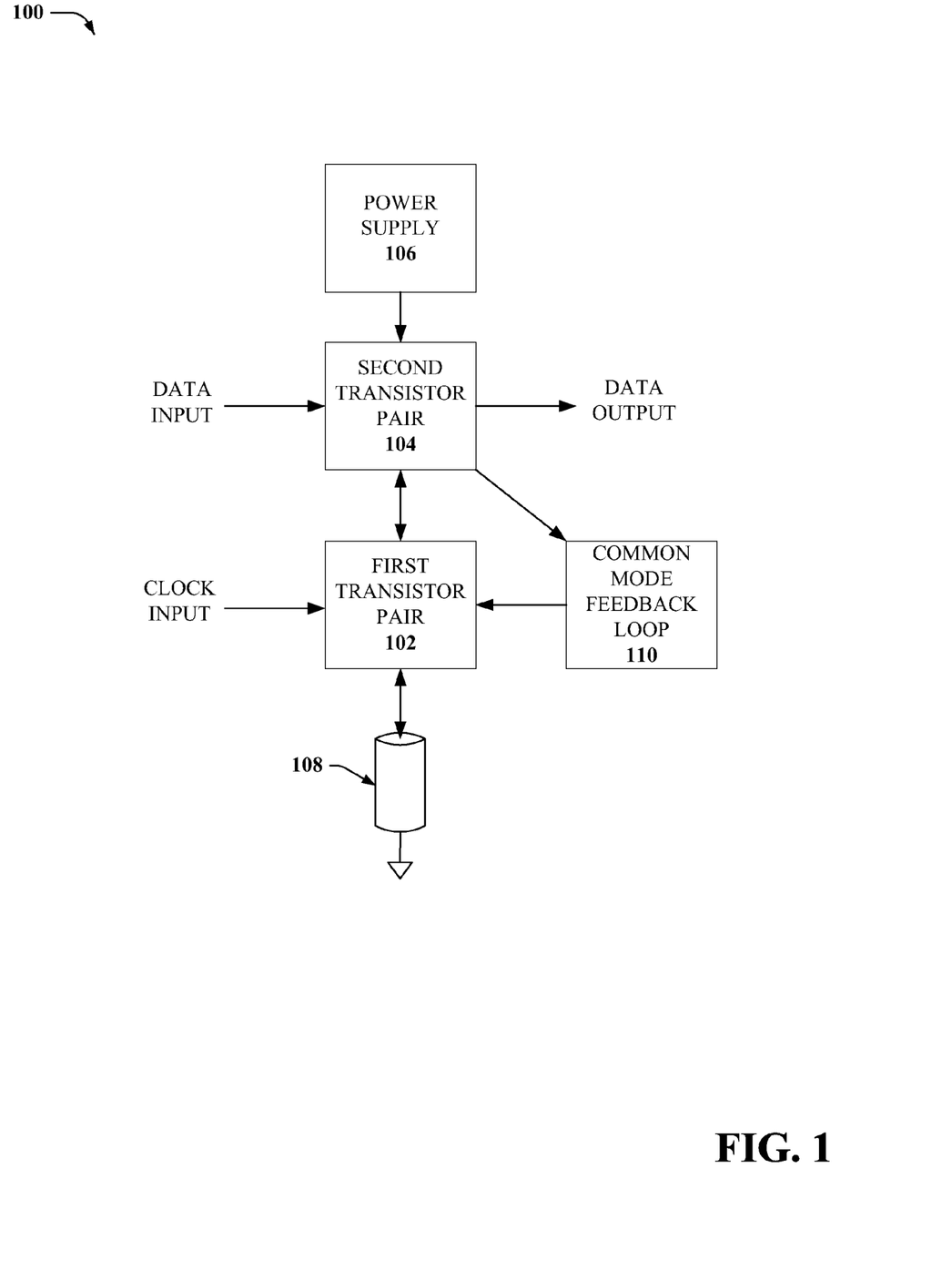
FIG. 1 is a block diagram illustration of a low voltage circuit, according to an implementation of the subject disclosure.

Turning now to FIG. 1, a block diagram illustration of a low voltage circuit, according to an implementation of the subject disclosure is shown. System 100 includes a first transistor pair 102, a second transistor pair 104, a power supply 106, a tail inductor 108, and a CMFB loop 110. It is to be appreciated that the first and second transistor pairs 102 and 104 and the CMFB loop 110 are drawn as boxes for simplicity of illustration. It is also to be appreciated that the boxes represent one or more transistor pairs and that more than two layers of transistor pairs are possible in other implementations of the disclosure.

The first transistor pair 102 receives clock inputs. In some implementations, the clock inputs are used to approximate a frequency reference for high speed serial data streams that are sent without an accompanying clock signal. The second transistor pair 104 receives the data stream and then sends the data output to the next logic gate or circuit. In some implementations, the first and the second transistor pairs 102 and 104 phase align the transitions in the data stream with a phase locked loop such as in a CDR circuit. In other implementations, the first and the second transistor pairs 102 and 104 make up a portion of a parallel clock SerDes that uses an internal or external phased locked loop to multiply the incoming parallel clock up to the serial frequency. Other applications for this architecture are possible in additional implementations of the subject disclosure.

The tail inductor 108 stabilizes current flow during clock transitions. As the current switches during the clock transition, the change in current generates a counter electromotive force ("EMF") in the inductor. The counter EMF is a voltage that 'pushes' against the current which induces it. The polarity of the counter EMF is thus opposite to the input voltage. As the frequency of the clock transitions increase, the counter EMF increases, resulting in a greater reactance, or impedance, in the inductor, which provides a greater stabilizing effect. The tail inductor also improves metastability performance by suppressing high frequency common mode bounce induced by clock transitions in independent common emitter branches.

For the low frequency portion of the effective "tail source", when the stabilizing effect of the tail inductor is reduced, CMFB loop 110 maintains a constant average current and output swing across process, voltage, and temperature variations. In some implementations, the CMFB loop has a control node that provides a reference voltage. Together, the tail inductor 108 and the CMFB loop 110 provide a functionality similar to a tail current source (at high frequencies and low frequencies respectively) without using additional voltage headroom.

It is to be appreciated that the tail inductor 108 and the CMFB loop 110 are coupled to a plurality of circuits. In some implementations, the tail inductor 108 is coupled to a plurality of transistor pairs that accept clock inputs, and in other implementations, the tail inductor 108 is coupled to a single transistor pair that accepts clock inputs, wherein the single transistor pair is in turn coupled to a plurality of transistor pairs that accept data inputs. Likewise, the CMFB loop 110 is coupled to any combination of transistor pairs that make up a plurality of circuits. While FIG. 1 depicts CMFB loop 110 and tail inductor 108 coupled to a first and second transistor pair 102 and 104, this is merely a non-limiting example implementation.

Figure 2:
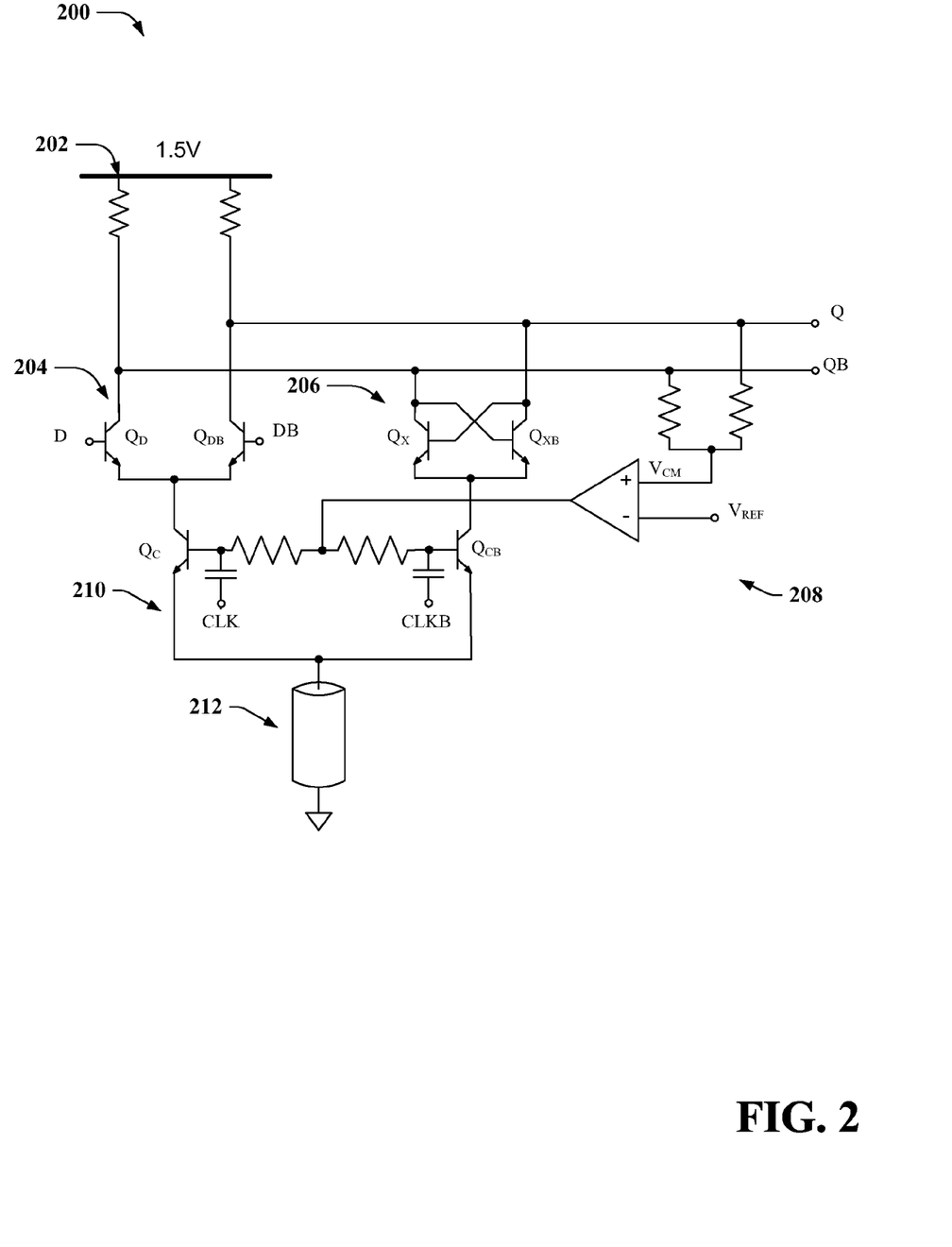
FIG. 2 is a schematic illustration of a low voltage circuit, according to an implementation of the subject disclosure.

Turning now to FIG. 2, illustrated is a schematic low voltage circuit, according to an implementation of the subject disclosure. Circuit 200 includes transistor pairs 204 and 206 that are stacked on transistor pair 210 that receives clock inputs. CMFB loop 208 and tail inductor 212 are coupled to the transistor pairs and serve the same function as a tail current source in stabilizing current flow and reducing jitter.

Power supply 202 supplies power to circuit 200, and can be rated at 1.5V. It is to be appreciated that power supplies with voltages other than 1.5V are possible as well. For instance, power supply 202 can supply power with voltage between 1-3V in other implementations. Line side circuits implemented at 1.5V avoid supply domain translators and converters and allow an entire SerDes signal path to use one board-level supply.

The transistor pairs 204 and 206 that are stacked on transistor pair 210, can be any of a variety of transistor pairs. Two transistor pairs on the top level are depicted in the diagram, but in other implementations, one transistor pair, or additional transistor pairs are possible. In FIG. 2, transistor pair 204 serves as a data amplifer for data arriving at D and DB, and transistor pair 206 forms a latch. In other implementations, other types of transistor pairs are used. Transistor pairs 204, 206, and 210 are depicted in FIG. 2 as NPN bipolar junction transistors. In other implementations, PNP type bipolar junction transistors and field effect transistors are used. In one implementation of the subject disclosure, large heterojunction bipolar transistors are operated at low current densities to help avoid saturation and reduce mismatch. The large heterojunction bipolar transistors also make 1.5V operation possible by minimizing base emitter voltage and collector resistance I*R drops. In some implementations, using bipolar devices for clocking latches improves speed and reduces load and parasitics on CLK/CLKB nets, which can further save power.

Transistor pair 210 receives clock inputs and uses the clock inputs to approximate a frequency reference for high speed serial data streams received by transistor pair 204 that are sent without an accompanying clock signal. The tail inductor 212 coupled to transistor pair 210 improves metastability performance by suppressing high-frequency common mode bounce induced by clock transitions in independent common emitter branches. The stabilizing effect of the tail inductor 212 can become larger as the frequency of the clock transitions increases due to the rising reactance of the inductor. In some implementations, tail inductor 212 is coupled to transistor pairs from a plurality of circuits.

CMFB loop 208 maintains a constant average current and output swing across process, voltage and temperature variations. Together, the tail inductor 212 and the CMFB loop 208 provide a functionality similar to a tail current source (at high frequencies and low frequencies respectively) without using additional voltage headroom.

Figure 3:
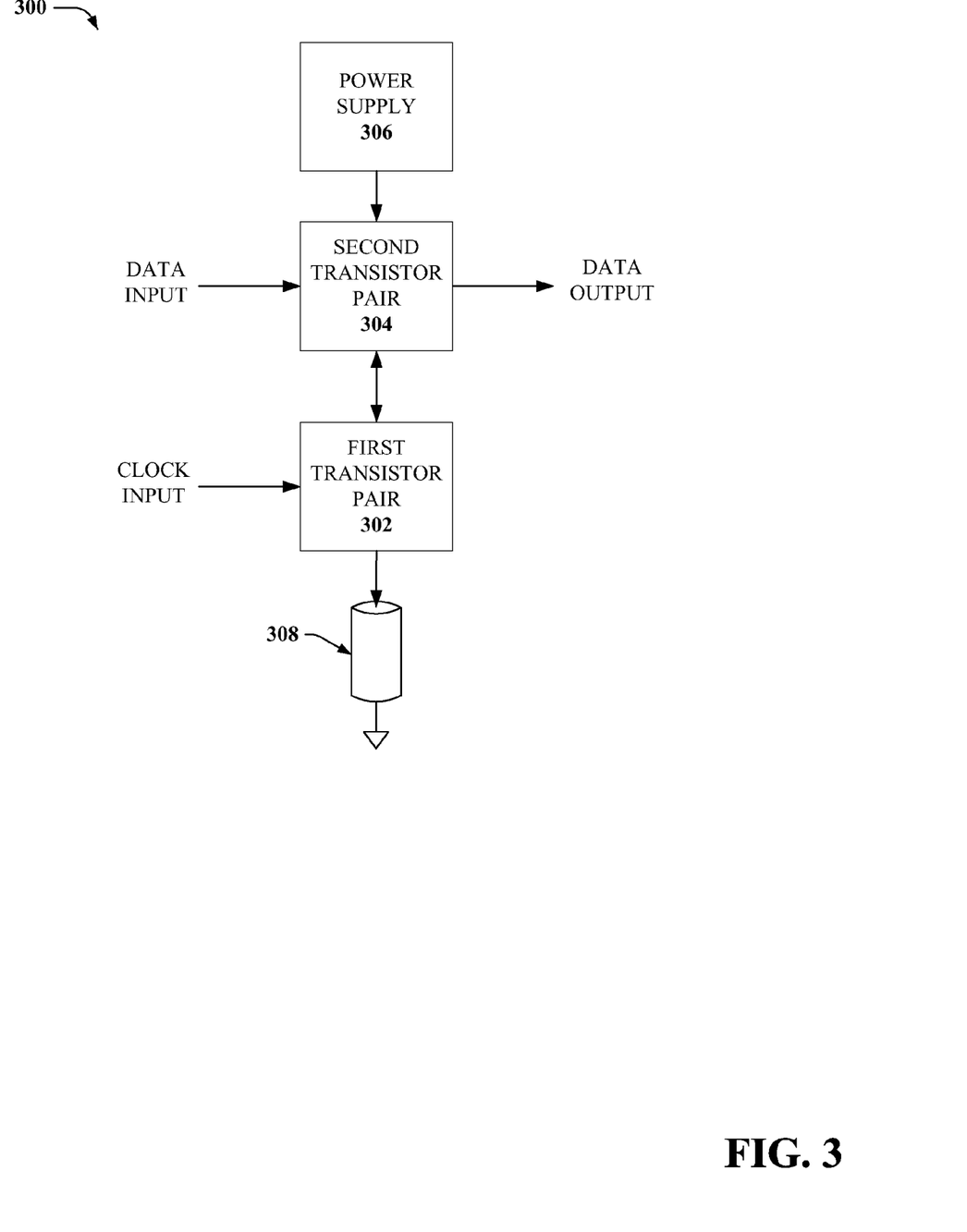
FIG. 3 is a block diagram illustration of a low voltage circuit, according to an implementation of the subject disclosure.

Turning now to FIG. 3, a block diagram illustrating a low voltage circuit in accordance with an implementation of the subject disclosure is shown. System 300 includes a first transistor pair 302, a second transistor pair 304, a power supply 306 and a tail inductor 308. It is to be appreciated that the first and second transistor pairs 302 and 304 are drawn as boxes for simplicity of illustration. It is also to be appreciated that the boxes can represent one or more transistor pairs and that more than two layers of transistor pairs are possible in other implementations of the disclosure.

The first transistor pair 302 receives clock inputs. In some implementations, the clock inputs are used to approximate a frequency reference for high speed serial data streams that are sent without an accompanying clock signal. The second transistor pair 304 receives the data stream and then sends the data output to the next logic gate or circuit. In some implementations, the first and the second transistor pairs 302 and 304 phase align the transitions in the data stream with a phase locked loop such as in a CDR circuit. In other implementations, the first and second transistor pairs 302 and 304 make up a portion of a parallel clock SerDes that uses an internal or external phased lock loop to multiply the incoming parallel clock up to the serial frequency.

The tail inductor 308 stabilizes current flow during clock transitions. As the current switches during the clock transition, the change in current generates impedance in the inductor that 'pushes' against the current which induces it. As the frequency of the clock transitions increase, the impedance increases, resulting in a greater stabilizing effect. The tail inductor also improves metastability performance by suppressing high frequency common mode bounce induced by clock transitions in independent common emitter branches. Unlike in FIGS. 1-2, the implementation shown in FIG. 3 does not include a CMFB loop. At high frequency clock transitions, the CMFB loop is less effective than the tail inductor at stabilizing current, and so, in high frequency circuits, for increased simplicity, the tail inductor 308 can be used without a CMFB loop.

Figure 4:
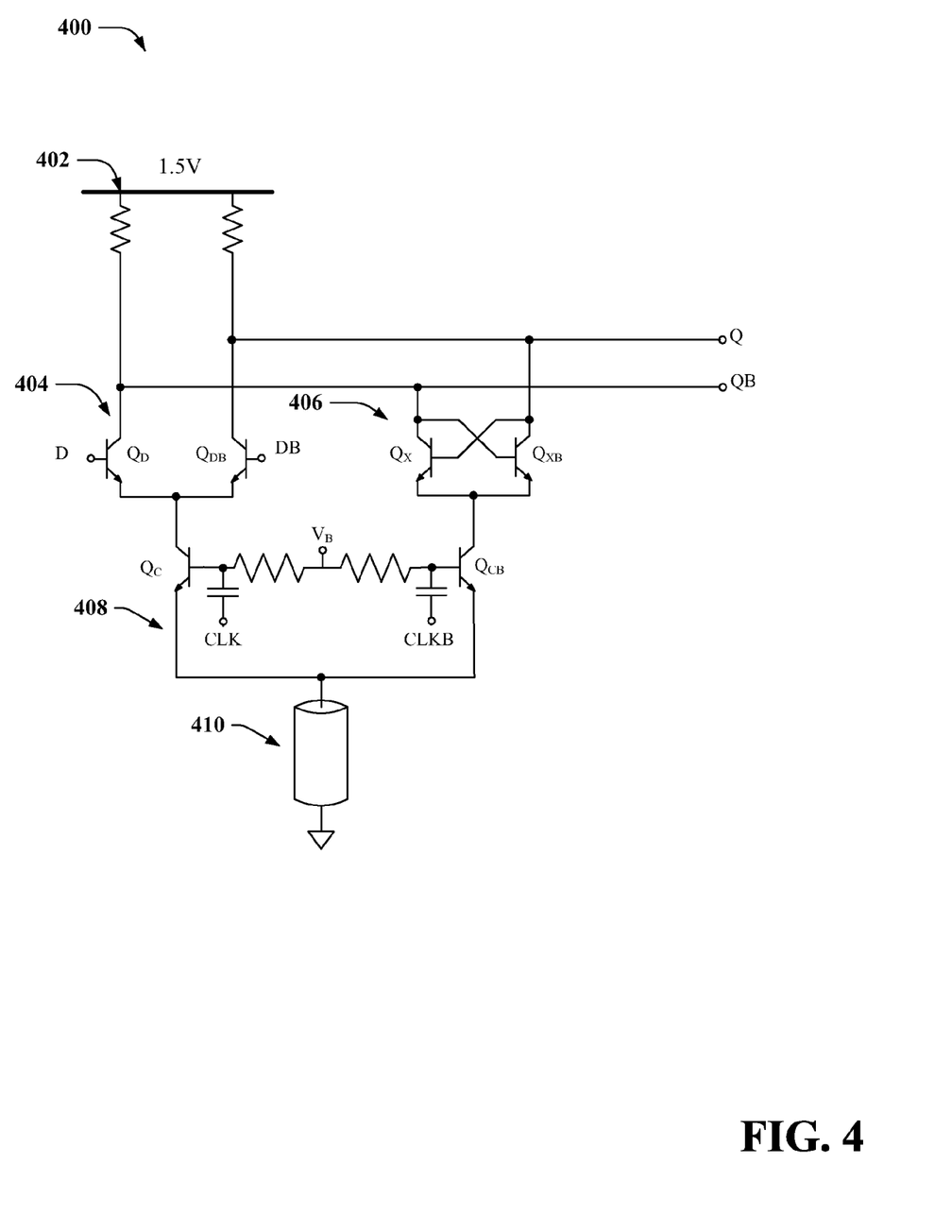
FIG. 4 is a schematic illustration of a low voltage circuit, according to an implementation of the subject disclosure.

Turning now to FIG. 4, illustrated is a schematic low voltage circuit, in accordance with an implementation of the subject disclosure. Circuit 400 corresponds to the block diagram of FIG. 3. Circuit 400 includes transistor pairs 404 and 406 that are stacked on transistor pair 408. Transistor pair 408 is configured to receive clock inputs, while transistor pair 404 is configured to receive high speed data streams as input. A power supply 402 can be provided to power circuit 400 and can be rated at 1.5V. It is to be appreciated that power supplies with voltages other than 1.5V are possible as well. For instance, power supply 402 can supply power with voltage between 1-3V in other implementations.

The transistor pairs 404 and 406 that are stacked on transistor pair 408, can be any of a variety of transistor pairs. Two transistor pairs on the top level are depicted in the diagram, but in other implementations, one transistor pair, or additional transistor pairs are possible. In FIG. 4, transistor pair 404 serves as a data amplifer for data arriving at D and DB, and transistor pair 406 forms a latch. In other implementations, other types of transistor pairs are used.

Transistor pair 408 receives clock inputs and uses the clock inputs to approximate a frequency reference for high speed serial data streams received by transistor pair 404 that are sent without an accompanying clock signal. The tail inductor 410 coupled to transistor pair 408 improves metastability performance by suppressing high-frequency common mode bounce induced by clock transitions in independent common emitter branches. The stabilizing effect of the tail inductor 410 becomes larger as the frequency of the clock transitions increases due to the rising reactance of the inductor. In some implementations, tail inductor 410 is coupled to transistor pairs from a plurality of circuits.

Figure 5:
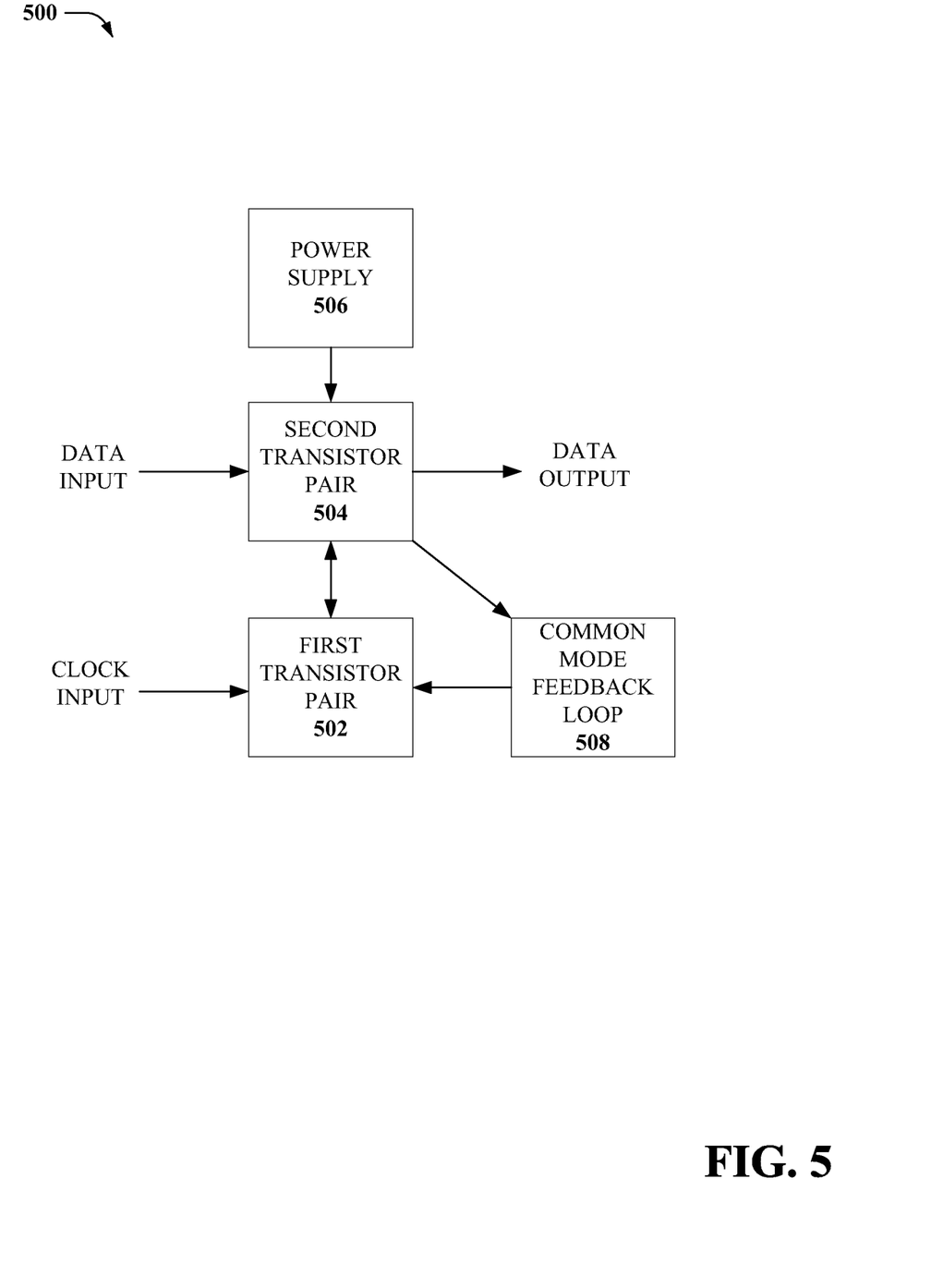
FIG. 5 is a block diagram illustration of a low voltage circuit, according to an implementation of the subject disclosure.

Turning now to FIG. 5, a block diagram illustrating a low voltage circuit according to an implementation of the subject disclosure is shown. System 500 includes a power 506, a first transistor pair 502 that receives a clock input, a second transistor pair 504 stacked on the first transistor pair 502, and a CMFB loop 508 coupled to the first and second transistor pairs 502 and 504. It is to be appreciated that the first and second transistor pairs 502 and 504 and the CMFB loop 508 are drawn as boxes for simplicity of illustration. It is also to be appreciated that the boxes can represent one or more transistor pairs and that more than two layers of transistor pairs are possible in other implementations of the disclosure.

The first transistor pair 502 receives clock inputs. In some implementations, the clock inputs are used to approximate a frequency reference for high speed serial data streams that are sent without an accompanying clock signal. The second transistor pair 504 receives the data stream and then sends the data output to the next logic gate or circuit. In some implementations, the first and the second transistor pairs 502 and 504 can phase align the transitions in the data stream with a phase locked loop such as in a CDR circuit. In other implementations, the first and second transistor pairs 502 and 504 make up a portion of a parallel clock SerDes that uses an internal or external phased lock loop to multiply the incoming parallel clock up to the serial frequency. The CMFB loop 508 can ensure that the average current in the circuit remains constant.

Figure 6:
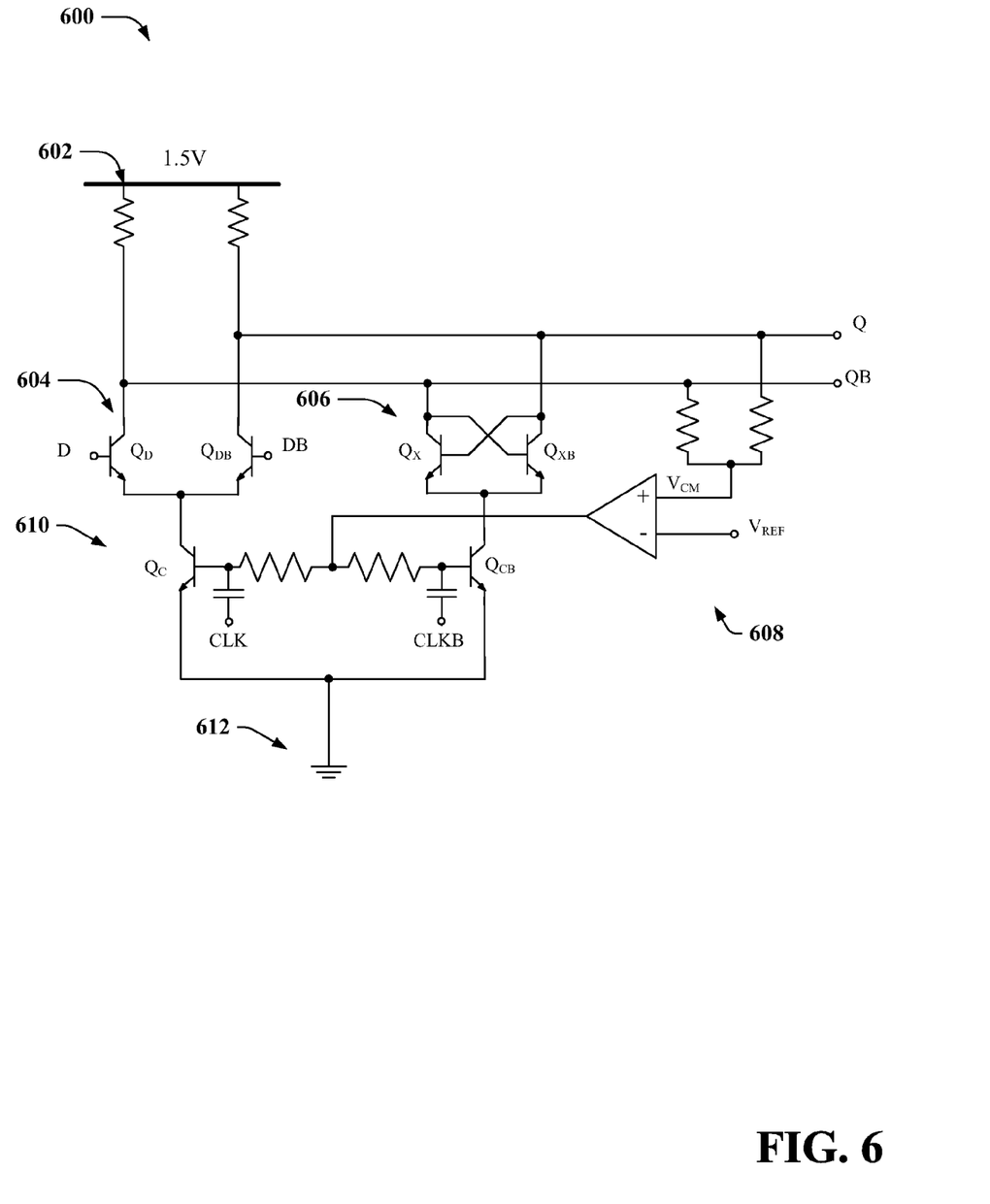
FIG. 6 is a schematic illustration of a low voltage circuit, according to an implementation of the subject disclosure.

Turning now to FIG. 6, a schematic illustration of a low voltage circuit in accordance with an implementation of the subject disclosure is shown. Circuit 600 corresponds to the block diagram of FIG. 5. Circuit 600 includes transistor pairs 604 and 606 that are stacked on transistor pair 610. Transistor pair 610 is configured to receive high speed data streams as input. A power supply 602 is provided to power circuit 600 and can be rated at 1.5V. It is to be appreciated that power supplies with voltages other than 1.5V are possible as well. For instance, power supply 602 can supply power with voltage between 1-3V in other implementations.

The transistor pairs 604 and 606 that are stacked on transistor pair 610, can be any of a variety of transistor pairs. Two transistor pairs on the top level are depicted in the diagram, but in other implementations, one transistor pair, or additional transistor pairs are possible. In FIG. 6, transistor pair 604 serves as a data amplifer for data arriving at D and DB, and transistor pair 606 forms a latch. In other implementations, other varieties of transistor pairs can be used.

Transistor pair 610 receives clock inputs and uses the clock inputs to approximate a frequency reference for high speed serial data streams received by transistor pair 404 that are sent without an accompanying clock signal. CMFB loop 608 can ensure that the average current in the circuit remains constant. Circuit 600 does not include a tail inductor. For low frequency portions of the signal content, the tail inductor is less effective than the CMFB loop at stabilizing and maintaining an average current. Accordingly, in low frequency circuits, for increased simplicity, the CMFB loop 608 is used without a tail inductor.

Figure 7:
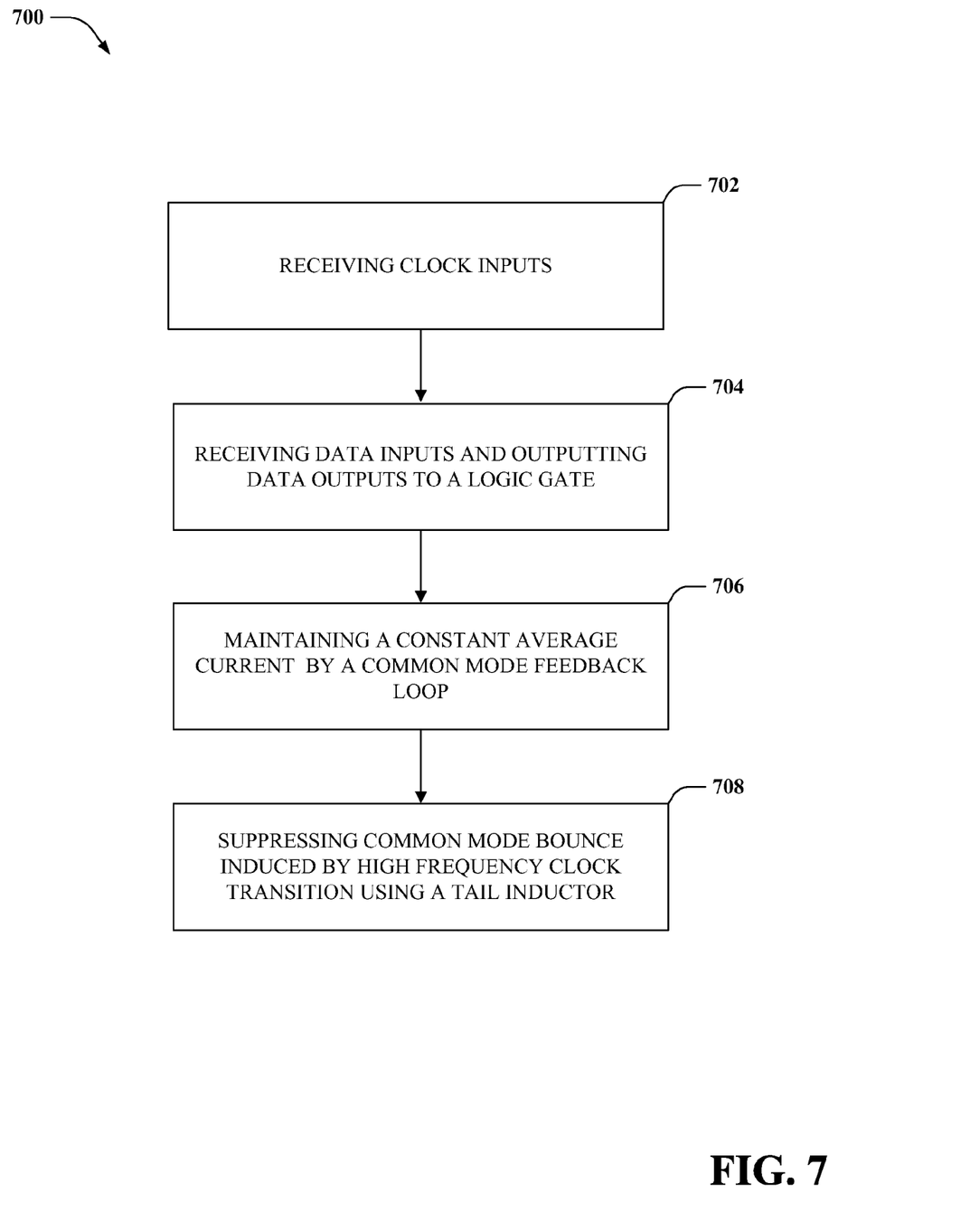
FIG. 7 is a schematic process flow diagram of a method for stabilizing current in low voltage circuits, according to an implementation of the subject disclosure.
Figure 8:
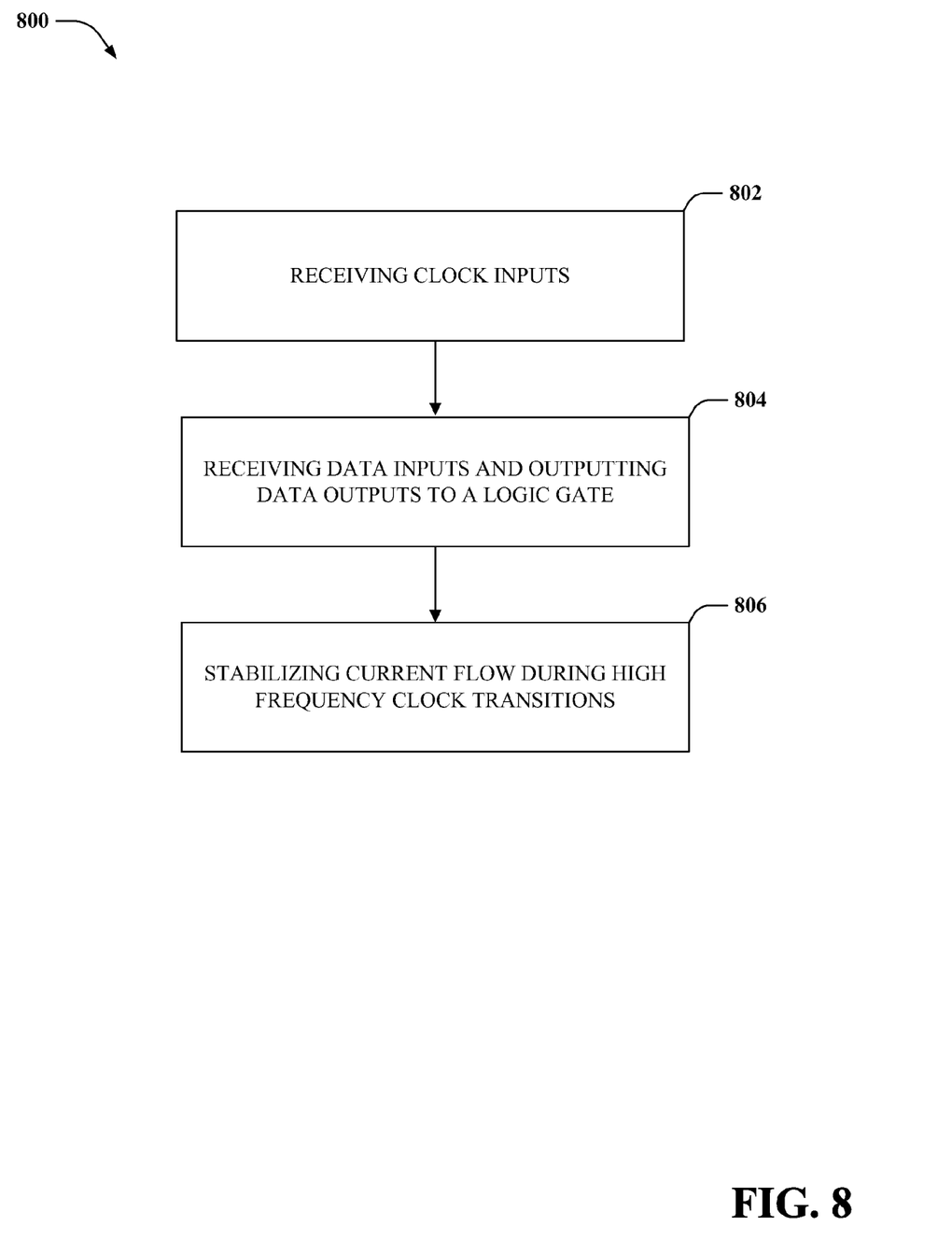
FIG. 8 is a schematic process flow diagram of a method for stabilizing current in low voltage circuits, according to an implementation of the subject disclosure.

FIGS. 7-8 show methods illustrated as flow diagrams. For simplicity of explanation, the methods are depicted and described as series of acts. However, the methods are not limited by the acts illustrated and by the order of acts. For example, acts can occur in various orders and/or concurrently, and with other acts not presented and described herein. Furthermore, not all illustrated acts may be required to implement the methods. Additionally, it should be further appreciated that the methods can be implemented on an article of manufacture (e.g., a low-voltage circuit) to facilitate transporting and transferring the methods.

Referring now to FIG. 7 illustrated is a schematic process flow diagram of a method 700 for stabilizing current in low voltage circuits. At step 702, clock inputs are received. The clock inputs are received by a transistor pair and can be used as a frequency reference for high speed serial data streams received by another transistor pair at step 704, where data inputs are received and the resulting outputs are outputted towards a logic gate. In some implementations, transitions in the data stream are phase aligned with a phase locked loop such as in a CDR circuit. Other applications for this architecture are possible in additional implementations of the subject disclosure.

At step 706, a constant average current is maintained by a CMFB loop. At 708, common mode bounce induced by high frequency clock transitions is suppressed by a tail inductor. As the current switches during the clock transition, the change in current generates a counter electromotive force ("EMF") in the inductor. The counter EMF is a voltage that 'pushes' against the current which induces it. The polarity of the counter EMF is thus opposite to the input voltage. As the frequency of the clock transitions increase, the counter EMF increases, resulting in a greater reactance, or impedance, in the inductor, which provides a greater stabilizing effect. Together, the tail inductor and the CMFB loop function as a tail current source (at high frequencies and low frequencies respectively) without using additional voltage headroom.

Referring now to FIG. 8, illustrated is a schematic process flow diagram of a method 800 for stabilizing current in low-voltage circuits. At step 802, clock inputs are received. The clock inputs are received by a transistor pair and can be used as a frequency reference for high speed serial data streams received by another transistor pair at step 804, where data inputs are received and the resulting outputs are outputted towards a logic gate. In some implementations, transitions in the data stream are phase aligned with a phase locked loop such as in a CDR circuit. Other applications for this architecture are possible in additional implementations of the subject disclosure.

At step 806, current flow is stabilized during high frequency clock transitions (e.g., by a tail inductor). Although the tail inductor is not as effective as a CMFB loop at lower frequency clock transitions, in circuits that operate primarily at high frequency, a tail inductor can provide a stabilizing effect without need for a CMFB loop.

The above description of illustrated implementations, including what is described in the Abstract, is not intended to be exhaustive or to limit the disclosed implementations to the precise forms disclosed. While specific implementations and examples are described herein for illustrative purposes, various modifications are possible that are considered within the scope of such implementations and examples, as those skilled in the relevant art can recognize.

As used herein, the word "example" is used herein to mean serving as an example, instance, or illustration. For the avoidance of doubt, the subject matter described herein is not limited by such examples. In addition, any aspect or design described herein as an "example" is not necessarily to be construed as preferred or advantageous over other aspects or designs, nor is it meant to preclude equivalent structures and techniques known to those of ordinary skill in the art. Furthermore, to the extent that the terms "includes," "has," "contains," and other similar words are used in either the detailed description or the claims, such terms are intended to be inclusive—in a manner similar to the term "comprising" as an open transition word—without precluding any additional or other elements.

In this regard, while the described subject matter has been described in connection with various implementations and corresponding Figures, where applicable, it is to be understood that other similar implementations can be used or modifications and additions can be made to the described implementations for performing the same, similar, alternative, or substitute function of the disclosed subject matter without deviating therefrom. Therefore, the disclosed subject matter should not be limited to any single implementation described herein, but rather should be construed in breadth and scope in accordance with the appended claims.

What is claimed is:

1. An apparatus, comprising:
a first transistor pair that accepts clock inputs;
a second transistor pair that receives data inputs and sends data outputs to a logic gate, wherein the second transistor pair is stacked upon the first transistor pair; and
a tail inductor coupled to the first transistor pair, wherein the tail inductor stabilizes current flow during clock transitions at high frequency.

2. The apparatus of claim 1, further comprising:
a circuit configured to generate a clock waveform that has a defined frequency for a high-speed serial data stream, wherein the first transistor pair and the second transistor pair are utilized to phase align the clock waveform to transitions in the high-speed serial data stream based on employing a phase locked loop circuit.

3. The apparatus of claim 1, wherein the tail inductor suppresses high frequency common mode bounce induced by the clock transitions in independent common emitter branches.

4. The apparatus of claim 1, further comprising a common mode feedback loop.

5. The apparatus of claim 4, wherein the common mode feedback loop maintains a constant average current.

6. The apparatus of claim 4, wherein the common mode feedback loop is shared between a plurality of circuits.

7. The apparatus of claim 4, wherein the tail inductor is shared between a plurality of circuits 8. The apparatus of claim 1, wherein an operating voltage is under 2.0 volts.

9. The apparatus of claim 1, wherein the first and the second transistor pairs are at least one of heterojunction bipolar transistors, bipolar transistors or field effect transistors.

10. A low-voltage circuit, comprising:
a first transistor pair that accepts periodic inputs;
a second transistor pair that receives data inputs and sends data outputs to a logic gate, wherein the second transistor pair is stacked upon the first transistor pair;
a common mode feedback loop that maintains a constant average current; and
a tail inductor coupled to the first transistor pair, wherein the tail inductor suppresses high frequency common mode bounce induced by clock transitions in independent common emitter branches.

11. The low-voltage circuit of claim 10, wherein the common mode feedback loop is shared between a plurality of low-voltage circuits.

12. The low-voltage circuit of claim 10, further comprising a control node that provides a reference voltage.

13. The low-voltage circuit of claim 10, wherein an operating voltage of the low-voltage circuit is under 2.0 volts.

14. The low-voltage circuit of claim 10, wherein the tail inductor is coupled to a plurality of low-voltage circuits.

15. The low-voltage circuit of claim 10, wherein the tail inductor stabilizes current flow during high frequency clock transitions and the common mode feedback loop maintains a constant average current.

16. The low-voltage circuit of claim 10, wherein the first and the second transistor pairs are at least one of heterojunction bipolar transistors, bipolar transistors or field effect transistors.

17. The low-voltage circuit of claim 10, further comprising:
 a phase locked loop circuit that phase aligns a clock waveform generated for a high-speed serial data stream that is received by the second transistor pair, to transitions in the high-speed serial data stream.

18. A method for stabilizing current in low-voltage differential circuits comprising:
 receiving clock inputs;
 receiving data inputs and outputting data outputs to a logic gate;
 maintaining a constant average current by a common mode feedback loop; and
 suppressing common mode bounce induced by high frequency clock transitions using a tail inductor.

19. The method of claim 18, wherein the receiving the clock inputs and the data inputs is facilitated respectively by a first transistor pair and a second transistor pair.

20. The method of claim 18, wherein the suppressing common mode bounce further comprises suppressing common mode bounce in independent common emitter branches.

\* \* \* \* \*